US005635933A

United States Patent [19]
Fitzpatrick et al.

[11] Patent Number: 5,635,933
[45] Date of Patent: Jun. 3, 1997

[54] RATE 16/17 (D=0,G=6/I=7) MODULATION CODE FOR A MAGNETIC RECORDING CHANNEL

[75] Inventors: James Fitzpatrick; Kelly J. Knudson, both of Mountain View, Calif.

[73] Assignee: Quantum Corporation, Milpitas, Calif.

[21] Appl. No.: 497,182

[22] Filed: Jun. 30, 1995

[51] Int. Cl.⁶ .................................................. H03M 7/00
[52] U.S. Cl. ................................. 341/58; 341/59; 360/40
[58] Field of Search ........................... 341/58, 59; 360/40

[56] References Cited

U.S. PATENT DOCUMENTS

| | | | |
|---|---|---|---|
| 4,486,739 | 12/1984 | Franaszek et al. | 341/59 |
| 4,707,681 | 11/1987 | Eggenberger et al. | 340/347 |
| 5,260,703 | 11/1993 | Nguyen et al. | 341/100 |
| 5,387,911 | 2/1995 | Gleichert et al. | 341/58 |
| 5,420,583 | 5/1995 | Knecht et al. | 341/59 |
| 5,537,112 | 7/1996 | Tsang | 341/59 |

OTHER PUBLICATIONS

Anon, "Rate 16/17 (0,6,6) Code", *IBM Tech. Discl. Bull.*, vol. 31, No. 8, 1989 pp. 21-23.

*Primary Examiner*—Howard L. Williams
*Attorney, Agent, or Firm*—David B. Harrison

[57] ABSTRACT

A method for encoding a sequence of 16 bit digital data words into a sequence of 17 bit codewords in consonance with predetermined minimum zero run length (d), predetermined maximum zero run length (G) and maximum interleave zero run length (I) coding constraints of (d=0, G=6/I=7) for recording upon a magnetic medium within a magnetic recording channel is disclosed. The method includes dividing the 16 bit data word into an 8-bit A byte: a1, a2, a3, a4, a5, a6, a7, a8; and an 8-bit B byte b1, b2, b3, b4, b5, b6, b7, b8; separately testing the A and B bytes for violation of coding constraints, generating P and Q code bytes from the A and B bytes and inserting a center bit C of value one or zero between the P and Q code bytes to form the 17 bit codeword of a form p1, p2, p3, p4, p5, p6, p7, p8, C, q8, q7, q6, q5, q4, q3, q2, q1, in a manner minimizing hardware logic implementation.

8 Claims, 6 Drawing Sheets

| Violation in A | Violation in B | C | P Byte | Q Byte |
|---|---|---|---|---|
| No | No | 1 | Pass A Byte | Pass B byte |
| Yes | No | 0 | $Enc_1$(A byte) | Pass B byte |
| No | Yes | 0 | $Enc_2$(B byte) | Pass A byte |
| Yes | Yes | 0 | $Enc_3$(A byte) | $Enc_3$(B byte) |

FIG. 4

| $A_1$ | $A_2$ | $A_3$ | $A_4$ | $A_5$ | $A_6$ | $A_7$ | $A_8$ | C | $B_8$ | $B_7$ | $B_6$ | $B_5$ | $B_4$ | $B_3$ | $B_2$ | $B_1$ |
|---|---|---|---|---|---|---|---|---|---|---|---|---|---|---|---|---|
| 1 | 0 | 1 | 0 | 1 | 0 | 1 | 0 | 1 | 0 | 1 | 0 | 1 | 0 | 0 | 1 | 1 |
| 0 | 1 | 0 | 1 | 0 | 1 | 0 | 1 | 1 | 1 | 0 | 1 | 0 | 0 | 0 | 1 | 1 |

FIG. 5

| Violation Type | C | P Byte | Q Byte |
|---|---|---|---|
| (!AV) & (!BV) = 1 | 1 | Pass A Byte | Pass B byte |
| (AV) & (!bv) = 1 | 0 | $Enc_1$(A byte) | Pass B byte |
| (!av) & (BV) = 1 | 0 | $Enc_2$(B byte) | Pass A byte |
| (AV & BV) + (AV & bv) + (av + BV) =1 | 0 | $Enc_3$(A byte) | $Enc_3$(B byte) |

FIG. 6

```
Below are the encoder functions in terms of the intermediate variables above.
c = !AV & !BV;

Intermediate variables:

as = !a1 & !a2 & !a3 & !a4;
ae = !a2 & !a4 & !a6 & !a8;
ao = !a1 & !a3 & !a5 & !a7;
an = !a5 & !a6 & !a7 & !a8;
aff = a1 & a2 & a3 & a4 & a5 & a6 & a7 & a8;

bs = !b1 & !b2 & !b3 & !b4;
be = !b2 & !b4 & !b6 & !b8;
bo = !b1 & !b3 & !b5 & !b7;
bn = !b5 & !b6 & !b7 & !b8;
bff = b1 & b2 & b3 & b4 & b5 & b6 & b7 & b8;

AV = as + ae + aff;
BV = bs + be + bff;

av = as + ae + ao + an + aff;
bv = bs + be + bo + bn + bff;

c21 = ae & !a5 & !bv;
c22 = a3 & a5 & !bv;
c23 = as & !ae & !bv;
c24 = aff & !bv;
c2 = c21 + c22 + c23 + c24;

c31 = ae & !a5 & bv;
c32 = ae & a5 & bv;
c33 = as & !ae & bv;
c34 = ao & !as & !ae & BV;
c35 = an & !a0 & !as & !ae & BV;
c36 = aff & bv;
c3 = c31 + c32 + c33 + c34 + c35 + c36;

c41 = be & !bv & !av;
c42 = be & b5 & !av;
c43 = bs & !be & !av;
c44 = bff & !av;
c4 = c41 + c42 + c43 + c44;

c51 = be & !bv & av;
c52 = be & b5 & av;
c53 = bs & !be & av
c54 = b0 & !bs & !be & av
c55 = bn & !bo & !bs & !be & av;
c56 = bff & av;
c5 = c51 + c52 + c53 + c54 + c55 + c56;

FIG. 8

FIG. 10 ffa = !c & p1 & p2 & p3 & p4 & !p5 & !p6 & p7 & !p8;
ffb = !c & p1 & p2 & p3 & p4 & !p5 & p6 & !p7 & !p8;
ffab = !c & p1 & p2 & p3 & p4 & !p5 & p6 & p7 & !p8;
ff = ffa + ffb + ffab;

ca = (!c & (p2 xor p3) & p5 & !p6 & p8) + (!c & !p1 & p2 & p3 & !p4 & (p6 + p8))+ ffa;
cb = (!c & (p2 xor p3) & p5 & p6 & p8) + (!c & p1 & p2 & p3 & !p4 & (p6 + p8)) + ffb;
o = (!c & !p3 & !p5 & !p6 & p7 & (p2 + p4 + p1 & p8)) +
    !c & !p3 & !p5 & p6 & p7 & (p1 + p2 + p4));
n = (!c & p3 & p5 & !p6 & p7 & !p8)
cab = (!c & (p2 xor p3) & p5 & p6 & !p8 ) + 0 + n +
    (!c & !p1 & p2 & p3 & p4 & (p6 + p8)) + ffab;
ev = (!c & (p2 xor p3) & (p5 & p8 + p5 & p6));
s = (!c & (p6 + p8) & (!p1 & p2 & p3 + p2 & p3 & !p4));

cabbe = (cab & (q2 xor q3) & q5 & q6 & !q8);
cabbs = (cab & !q1 & q2 & q3 &q4 & (q6 + q8));
cabbo = (cab & !q3 &!q5 & !q6 & q7 & (q2 + q4 + q1 & q8)) +
    (cab & !q3 & !q5 & q6 & q7 & (q1 + q2 +q4));
cabbn = (cab & q3 & q5 & !q6 & q7 & !q8);
cabbf = (cab & a1 & q2 & q3 &q4 & !q6 & q6 & q7 & !q8);

caborca = cab + ca;
corca = c + ca;

a1 = p1 & ( c + caborca & ev + o + n + ffa + ffab) + q1 & cb;
a2 = p2 &( c + c0 + n + ffa + ffab) + q2 & cb;
a3 = p3 & (c + n + ffa + ffab) + p2 & ev & caborca + q3 & cb
a4 = p4 & ( c + 0 + n +ffa + ffab) + q4 & cb;
a5 = p5 & ( c + caborca & s ) + p4 & ev & caborca + ffa + ffab + q5 & cb;
a6 = p6 & (c + caborca & s + 0 + ffab) + ffa + q6 & cb;
a7 = p7 & (c + caborca & (s + ev) + ffa + ffab ) + q7 & cb;
a8 = p8 &(c + caborca & s + o) _ ffa + ffab + q8 & cb;

b1 = q1 & (corca + cabbo + cabbn + cabbe + cabbf) + p1 & cb & ev + ffb;
b2 = q2 & (corca + cabbo + cabbn + cabbf) + ffb;
b3 = q3 &( corca + cabbn + cabbf) + q2 & cabbe + p2 & cb & ev + ffb;
b4 = q4 & (corca + cabbo + cabbn + cabbf) + ffb;
b5 = q5 & (corca + cabbs) + q4 & cabbe + cabbf + ffb + p5 &cb & s + p4 & cb & ev;
b6 = q6 & (corca + cabbs + cabbo + cabbf) + p6 & cb & (s + ffb);
b7 = q7 & (corca + cabbs + cabbe + cabbf) + ffb + p7 & cb;
b8 = q8 & (corca + cabbs + cabbo ) + ffb + cabbf + p8 & cb & s;

FIG.11

RATE 16/17 (D=0,G=6/I=7) MODULATION CODE FOR A MAGNETIC RECORDING CHANNEL

SUMMARY OF THE INVENTION

The present invention relates to modulation codes and methods. More particularly, the present invention relates to a modulation code enabling magnetic recording systems to achieve higher data recording densities than with other modulation codes without sacrificing the reliability of playback data recovery.

BACKGROUND OF THE INVENTION

Modulation codes have been employed within magnetic recording channels in order to achieve a more even distribution of magnetic flux transitions within a data track in view of data patterns of particular user information being encoded and recorded. In particular, run length limited (RLL) modulation codes have been employed within partial response signaling, maximum likelihood detection (PRML) data recording and playback channels, decision feedback equalization (DFE) channels, and fixed delay tree search (FDTS) channels.

Partial response channels of interest for magnetic data storage devices include a (1-D) dicode channel, a PR4 (1-$D^2$) channel, and an EPR4 (1+D-$D^2$-$D^3$) channel. In these systems Viterbi detectors are frequently employed to achieve maximum likelihood detection of user data being played back from the recording medium. A modulation code for a PRML data recording and playback channel is selected to balance efficiency against robustness against errors.

The relevant technical literature provides examples of rate 8/9 (d=0, G=4/I=4) modulation codes, see e.g. U.S. Pat. Nos. 4,707,681 and 5,260,703. These references describe the utility and advantages of rate 8/9 modulation codes within the field of magnetic recording. While rate 8/9 modulation codes have been successfully employed within magnetic recording channels, a rate 16/17 (=0.941) modulation code achieves an approximately six percent (6%) increase in recording density over a standard rate 8/9 modulation code. The increased rate realized with a rate 16/17 modulation code means that each code bit recorded on the magnetic recording medium (disk or tape) contains approximately 6% more user data information than contained within a similar code bit in accordance with a rate 8/9 modulation code.

It has been proposed to map 16-bit user data words into a modulation code comprising 17;-bit code words, with the following specified coding constraints: the minimum zero run length distance d (or minimum number of zero cells between one cells within the code word), the maximum run length of an uninterrupted string of zeros G within the code word and accross codeword boundaries, and the maximum run length of an uninterrupted string of zeros I within a sequence of all-odd or all-even digit positions within the code. Thus, in a prior rate 16/17 modulation code, d=0, G=6 and I=6, meaning that the minimum zero run length was zero, the maximum run length of an uninterrupted string of zeros within the code word was six, and the maximum run length on an uninterrupted string of zeros within either an odd or even interleave was six. However, in this prior rate 16/17 modulation code, a large number of code words were required to be mapped, e.g. 65,536 words, as compared to 256 words required in the case of a rate 8/9 code. See "Rate 16/17 (0,6/6) Code", *IBM Tech. Discl. Bull.* Vol. 31, No. 8, Jan. 1989, pp. 21–23. While the approach reported in this article calls for symmetry in the code constraints with respect to bit positions in the code words and calls for insertion of a center bit between the code bytes, a number of drawbacks are present. In this prior approach, the assignment of the 65,536 code words was carried out using gated partitions, each of which was built upon a specific code structure. Also, a number of errors appear to be present in the disclosure, leading to difficulties with implementation, and uncertainty in achieving any successful utilization of the teaching thereof. Further, the described (0,6/6) code includes certain unesirable patterns, such as '11111 . . . 1', which are avoided by the present invention.

In recording systems using partial response signals (e.g. PR4 or EPR4) and maximum likelihood (i.e. Viterbi algorithm) detection, it is critical that consecutive even and odd samples into the detector have nonzero values frequently. Additionally, it is critical to constrain consecutive samples leading into a partial response detector so that they frequently comprise nonzero values. This constraint ensures that timing recovery and automatic gain loops will have sufficient information to perform adequately.

As explained, while rate 16/17 modulation codes have been proposed for magnetic recording channels, the prior art approaches have been complicated, and problematic, both in theory and practice. A hitherto unsolved need has remained for an improved rate 16/17 modulation code which achieves higher magnetic recording densities without sacrificing reliability of detected data and without requiring undue circuit complexity.

SUMMARY OF THE INVENTION WITH OBJECTS

A general object of the present invention is to provide a rate 16/17 (d=0, G=6/I=7) modulation code for use in a magnetic recording channel in a manner and form overcoming limitations and drawbacks of the prior art.

Another object of the present invention is to provide a practical rate 16/17 modulation code and implementation which achieves a high code rate without sacrificing reliability of detected data in a manner overcoming limitations of prior approaches.

A further object of the present invention is to provide a simplified, reliable encoding method for encoding 16 bit data words into 17 bit code words by directly mapping incoming bytes to code words separated by a center bit of unity value when such mapping results in 17 bit code words in consonance with predetermined modulation coding constraints, including minimum zero run length, maximum zero run length and maximum odd/even interleave zero run length, and replacing the incoming bytes with code bytes consistent with the coding constraints and with a center bit of zero value when direct mapping of the incoming bytes results in violation of the coding constraints.

In accordance with one aspect of the present invention, a method is realized for encoding a sequence of 16 bit digital data words into a sequence of 17 bit codewords in consonance with predetermined minimum zero run length (d), predetermined maximum zero run length (G) and maximum interleave zero run length (I) coding constraints of (d=0, G=6/I=7) for recording upon a magnetic medium within a magnetic recording channel. This method comprises the steps of:

dividing the 16 bit data word into an 8-bit A byte and an 8-bit B byte, separately testing the A and B bytes for violation of coding constraints, generating P and Q code bytes from the A and B bytes and inserting a center bit C of value one or zero between the P and Q code bytes to form the 17 bit codeword, in accordance with the following tests:

| Violation in A | Violation in B | C | P Byte | Q Byte |
|---|---|---|---|---|
| No | No | 1 | Pass A byte | Pass B byte |
| Yes | No | 0 | $Enc_1$ (A byte) | Pass B byte |
| No | Yes | 0 | $Enc_2$ (B byte) | Pass A byte |
| Yes | Yes | 0 | $Enc_3$ (A byte) | $Enc_3$ (B byte) | wherein $Enc_{1(A\ byte)}$, $Enc_{2(B\ byte)}$ and $Enc_{3(A,B\ bytes)}$ are distinct functions each of which mapping into a coded byte that can be concatenated with C=0 and another validly coded byte to create the 17 bit codeword in accordance with the predetermined d, G and I coding constraints: namely, that each codeword is guaranteed to begin or end with fewer than four consecutive zeros; each codeword is guaranteed to begin or end with fewer than four consecutive zeros in bits with even subscripts (i.e. bits $P_2$, $P_4$, $P_6$, $P_8$ or $Q_2$, $Q_4$, $Q_6$, $Q_8$); each codeword is guaranteed to begin or end with fewer than four consecutive zeros in bits with odd subscripts (i.e. bits $P_1$, $P_3$, $P_5$, $P_7$ or $Q_1$, $Q_3$, $Q_5$, $Q_7$); and, all runs of consecutive zeros within a codeword are shorter than seven bits long.

Within this aspect of the invention a further step includes precoding the sequence of 17 bit codewords in accordance with a predetermined precoding function for partial response signaling within the magnetic recording channel. For example, the magnetic recording channel may be a partial response class IV, maximum likelihood synchronous sampling data detection channel and the predetermined precoding function is $1/(1+D^2)$).

Figure 7:
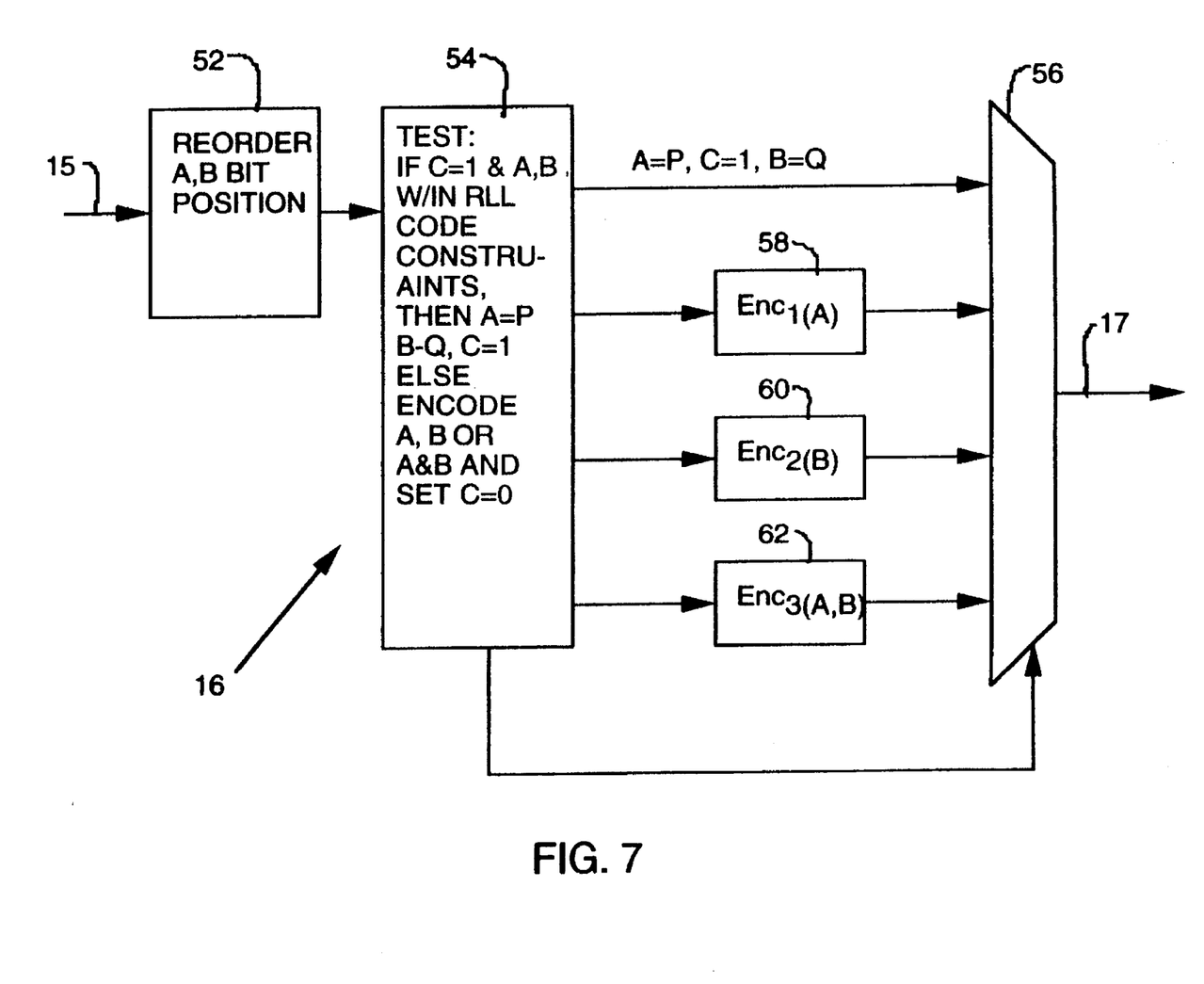
FIG. 7 is a highly diagrammatic conceptual block diagram of an encoder of the FIG. 1 magnetic recording and playback device in accordance with principles of the present invention.
Figure 8:
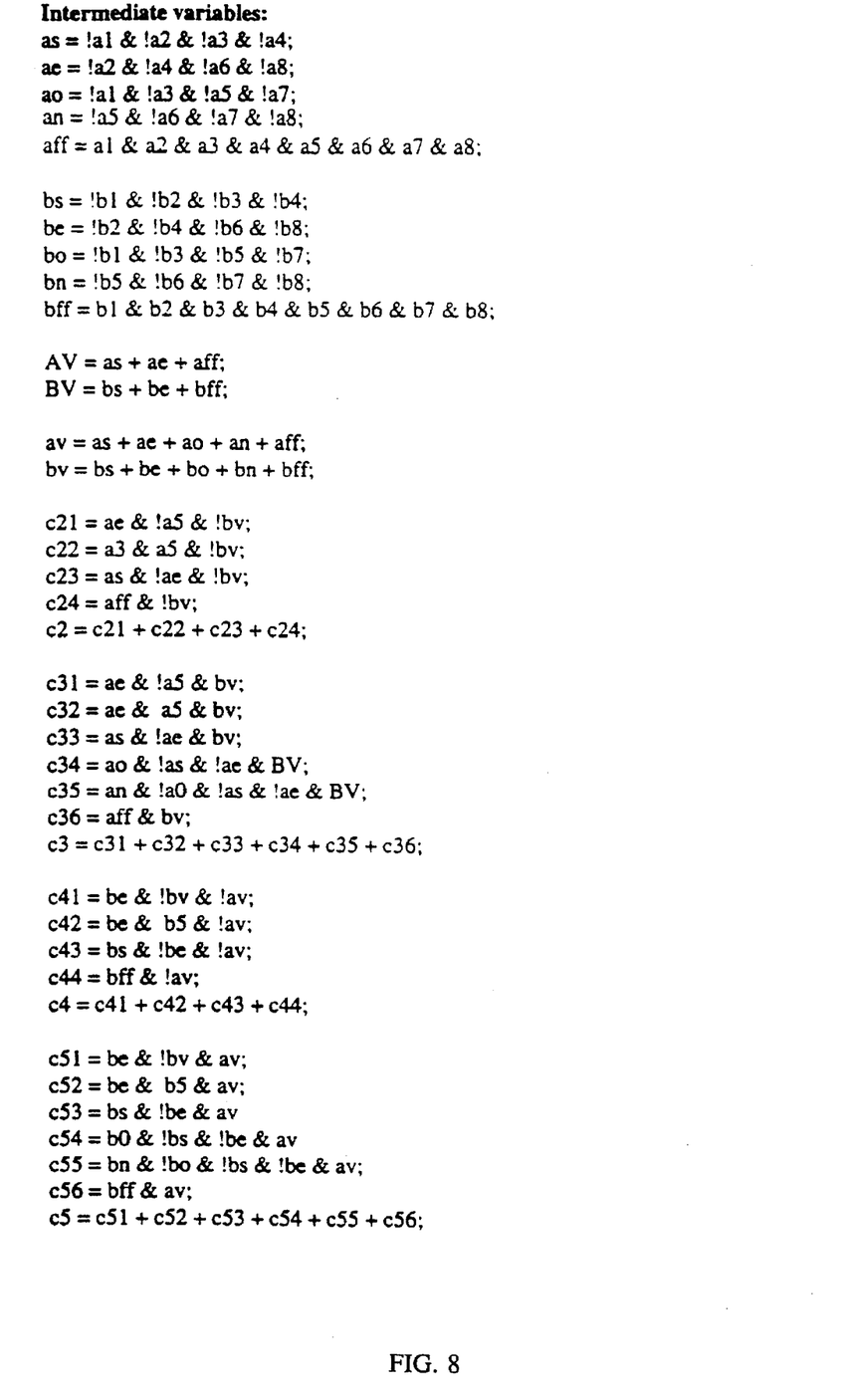
FIG. 8 sets forth a series of logic equations representing intermediate variables within an encoding process carried out within the FIG. 7 encoder in accordance with principles of the present invention.

Within this aspect of the invention, the encoding functions $Enc_{1(A\ byte)}$, $Enc2_{(B\ byte)}$ and $Enc_{3(A,B\ bytes)}$ may be in accordance with the FIGS. 7 & 8 tables of the drawings hereof.

Also within this aspect of the invention, the step of dividing the 16 bit data word may be carried out by arranging bit positions of the A and B bytes symmetrically about the center bit C.

This aspect of the invention, particularly within a recording system, may further include decoding of the sequence of 17 bit codewords by the steps of:

testing the C bit to determine if C equals 1, and if so, decoding by mapping the P byte of the codeword directly to the A byte and the Q byte of the codeword directly to the B byte, if the C bit equals zero, testing the P byte of the codeword to determine encoding of the A byte, encoding of the B byte, or encoding of the A and B bytes, and if the P byte results from a set of bytes created from encoding a violation in the A byte, then decoding in accordance with $A=InvEnc_{1(P)}$ and B=Q, where $Invgnc_{1(P)}$ is the inverse of $Enc_{1(P)}$, if there was a violation in the B byte, then decoding in accordance with A=Q and $B=InvEnc_{2(P)}$, where $InvEnc_{2(P)}$ is the inverse of $Enc_{2(P)}$, if there were violations in the A and B bytes, then decoding in accordance with $A=InvEnc_{3(P)}$ and $B=InvEnc_{3(Q)}$, where $InvEnc_{3(P)}$ and $InvEnc_{3(Q)}$ are inverses respectively of $Enc_{3(P)}$ and $Enc_{3(Q)}$, and removing the C bit, in order to put out decoded 16 bit digital data words.

These and other objects, advantages, aspects and features of the present invention will be more fully understood and appreciated upon consideration of the following detailed description of a preferred embodiment, presented in conjunction with the accompanying drawings.

DETAILED DESCRIPTION OF A PREFERRED EMBODIMENT

Figure 1:
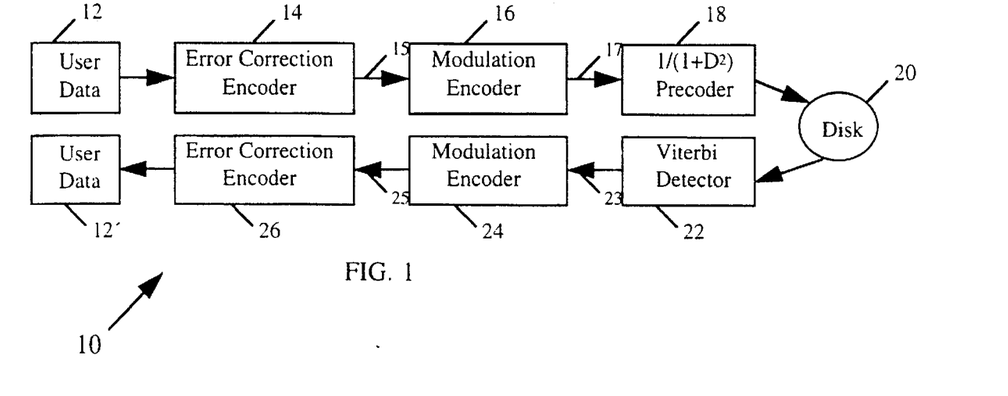
FIG. 1 is a block diagram illustrating data flow in a magnetic data storage device, such as a hard disk drive, employing partial response class IV signaling and maximum likelihood detection using a Viterbi algorithm detector.

FIG. 1 sets forth a block diagram of a magnetic recording and playback system 10, such as a hard disk drive. While a hard disk drive is a preferred use environment for the present invention, those skilled in the art will appreciate that the principles of this invention may be usefully applied to other devices, such as magnetic tape recording, for example. User data blocks 12 are received from a source, such as a host computer (not shown). The blocks are passed through an error correction encoder 14 which generates and appends ECC remainder bytes to the blocks in accordance with a preestablished ECC polynomial and scheme. The particular error correction encoder 14 may be conventional, and it is not further described herein. Each data block (now having a predetermined number of ECC bytes appended) then passes through a modulation encoder 16 (shown in greater functional detail in FIG. 7 and discussed hereinafter). The modulation encoder 16 is in accordance with principles of the present invention, and it encodes user data blocks as a stream of two-byte (16 bit) data words (including ECC bytes) into a sequence of 17 bit codewords, in accordance with a rate 16/17 modulation code (d=0, G=6/I=7), to be described in greater detail hereinafter. Within the device 10, each codeword is then passed serially through a PR4 precoder 18 having a function $1/(1+D^2)$. The precoded codewords are then recorded as sequences of magnetic flux transitions within a data track defined on a storage surface of a magnetic recording disk 20.

During playback, flux transitions induced in a read head element are subjected e.g. to analog/digital filter-equalization processes, quantized as digital samples, and applied to a detector 22 implementing a Viterbi algorithm. The Viterbi algorithm makes use of the code constraints imposed by the rate 16/17 modulation code in order to present at its output a playback codeword sequence which is most likely (although not necessarily) a correct reproduction of the original codeword sequence. The playback codeword sequence is then demodulated in a modulation decoder 24 also in accordance with principles of the present invention. Following decoding by the modulation decoder 24, each playback data block is passed through an error correction decoder 26 which checks the playback ECC bytes to locate and correct any correctable error bursts. Error corrected user data 12' is then returned to a requester, such as the host computer (not shown). If the error correction decoder determines that a data block includes uncorrectable errors, an error flag is returned to the requester, and a second attempt is made to read the data block from the disk 20.

Figure 2:
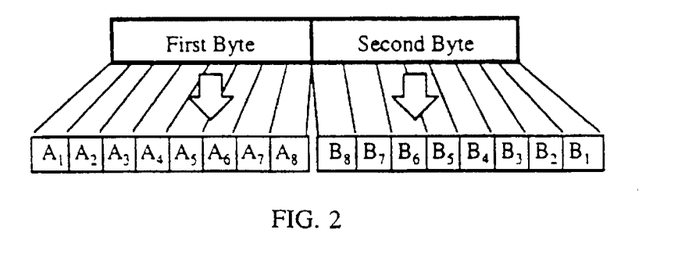
FIG. 2 is a diagram of a data block illustrating a labeling scheme employed in the present invention.

Returning to an input 15 of the modulation encoder 16 shown in FIG. 1, serial digital data words to be modulation encoded are passed, input word (two bytes) by input word (two bytes at a time), to the encoder 16 in a manner illustrated in FIG. 2. The sixteen bits of each input word, arranged (labeled) as shown in FIG. 2 are then encoded, according to an encoding function to be described, into a seventeen bit codeword. In the FIG. 2 example, the first byte is called the "A byte", and the second byte of the pair of bytes is called the "B byte". FIG. 2 illustrates the ordering of respective bit positions of the A byte and B byte relative to each other. Successive 17 bit codewords are then recorded on the disk 20 in the order shown in FIG. 3.

Figure 3:
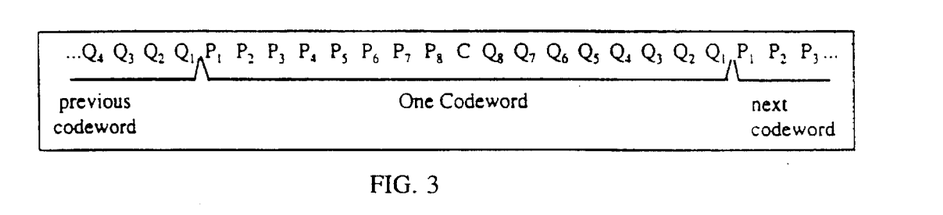
FIG. 3 is a diagram illustrating a serial sequence of successive codewords written to the FIG. 1 disk in the order illustrated.

Codewords having the form illustrated in FIG. 3 are valid (d=0, G=6/I=7) codewords, providing the following coding constraints are satisfied:

1. Each codeword is guaranteed to begin or end with fewer than four consecutive zeros.

2. Each codeword is guaranteed to begin or end with fewer than four consecutive zeros in bits with even subscripts (i.e. bits $P_2$, $P_4$, $P_6$, $P_8$ or $Q_2$, $Q_4$, $Q_6$, $Q_8$).

3. Each codeword is guaranteed to begin or end with fewer than four consecutive zeros in bits with odd subscripts (i.e. bits $P_1$, $P_3$, $P_5$, $P_7$ or $Q_1$, $Q_3$, $Q_5$, $Q_7$).

4. All runs of consecutive zeros within a codeword are shorter than seven bits long.

In order to satisfy the foregoing coding constraints, the following encoding procedure has been created. In most cases the A and B bytes passing into the modulation encoder 16 are passed directly to an output line 17 with a center or "C" bit being inserted between the A and B bytes. Most of the time, the C bit value is a "1". Specifically, if setting C=1 and passing $A_1, \ldots, A_8, B_8, \ldots, B_1$, as $P_1, \ldots, P_8, Q_8, \ldots, Q_1$, yields a codeword satisfying the four coding constraints, then the encoding process is carried out in this manner to achieve the resultant codeword.

Unfortunately, there are many two byte input words which do not yield proper codewords by the process of inserting a C=1 as the center bit. For these input words the incoming center bit is set to zero (C=0), and more complicated encoding rules are applied to incoming bits $A_1, \ldots, A_8, B_8,$ $\ldots, B_1$ to yield $P_1, \ldots P_8, Q_8, \ldots Q_1$. Upon decoding within the decoder 24, the center bit C is interrogated, and if it is equal to 1, then bits $P_1, \ldots, P_8, Q_8, \ldots, Q_1$ are mapped directly to $A_1, \ldots, A_8, B_8, \ldots, B_1$.

Figure 4:
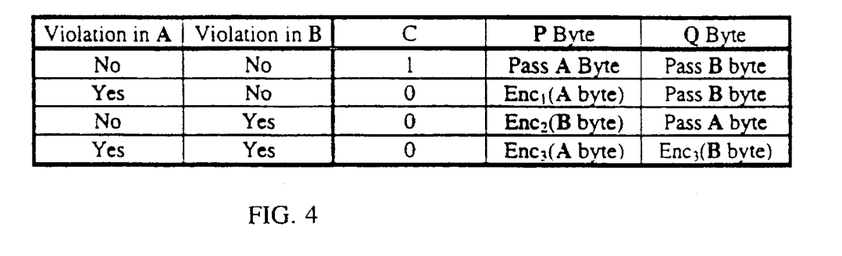
FIG. 4 is a table summarizing encoding rules according to violations in accordance with the present invention.

The set of encoder input words that cause code violations when C is set to 1 may be divided into three categories: 1) words in which a code violation occurs in the A byte, but not in the B byte (hereinafter $Enc_{1(A)}$); 2) codewords in which there is a code violation in the B byte but not in the A byte (hereinafter $Enc_{2(B)}$); and, 3) codewords in which there are code constraint violations in both the A and B bytes (hereinafter $Enc_{3(A,B)}$). When there is a violation in the A byte, but no violation in the B byte, the P byte is made equal to an encoding of the A byte consistent with the coding conventions ($Enc_{1(A)}$), while the Q byte is made equal to the B byte (with no encoding). When there is a violation in the B byte, but not in the A byte, then the P byte is made equal to an encoding of the B byte ($Enc_{2(b)}$), while the Q byte is set equal to the A byte (with no encoding). Finally, when there is a code constraint violation in both the A and B bytes, the P byte is set equal to an encoding of the A byte and the Q byte is set equal to an encoding of the B byte ($Enc_{3(A,B)}$). FIG. 4 summarizes the foregoing encoding steps, and FIG. 7 illustrates three functional encoders, each for performing one of the three encoding functions described herein.

As shown in FIGS. 4 and 7, the encoding functions $Enc_{1(A)}$, $Enc_{2(B)}$, and $Enc_{3(A,B)}$ may be conceived of as distinct functions that each map into a coded byte that may be concatenated with C being made equal to zero followed by a second valid coded byte in order to create a valid (d=0, G=6/I=7) codeword. In fact, the function blocks of FIG. 7 have been reduced to a single combinatorial logic block in accordance with the logic block equations of FIGS. 8 and 9. The ranges of $Enc_{1(A)}$, $Enc_{2(B)}$, and $Enc_{3(A,B)}$ (two bytes) are made to be distinct such that upon decoding a byte encoded by $Enc_{i()}$, it is unique from bytes encoded by $Enc_{j()}$, where $j \neq i$. The "P" bytes are all distinct.

In practice the encoding function performed by the modulation encoder 16, and the decoding function performed by the modulation decoder 24 are preferably implemented with combinatorial logic. Accordingly, the encoder 16 employs 16 logical functions, while the decoder 24 employs 17 logical functions.

A series of logical variables are created in order to define the structure of the modulation encoder 16. Five simple tests are applied to the A and B bytes:

Test 1: Are the first four bits of the byte consecutive zeros?

Test 2: Are the even bits of the byte all equal to zero?

Test 3: Are the odd bits of the byte all equal to zero?

Test 4: Are the last four bits of the byte all equal to zero?

Test 5: Is the byte made up of all ones?

Test 5 is used to eliminate the "all ones" pattern from the code. The "all ones" pattern is recorded as a fixed frequency (i.e. ¼ T) on the disk and is identical to a preamble pattern which may be used to set timing and gain loops.

We define ten variables to represent the result of each of the foregoing five tests upon the two bytes of the input word, as follows:

AS=1, if byte A starts with four consecutive bits equal to zero, (A1=A2=A3=A4=0).

AE=1, if byte A has all four consecutive even bits equal to zero, (A2=A4=A6=A8=0).

AO=1, if byte A has all four consecutive odd bits equal to zero (A1=A3=A5=A7=0).

AN=1, if byte A ends with four consecutive zeros (A5=A6=A7=A8=0).

AFF=1, if byte A is composed entirely of ones (A1=A2=...=A8=1).

BS=1, if byte B starts with four consecutive bits equal to zero (B1=B2=B3=B4=0).

BE=1, if byte B has all four consecutive even bits equal to zero (B2=B4=B6=B8=0).

BO=1, if byte B has all four consecutive odd bits equal to zero (B1=B3=B5=B7=0).

BN=1, if byte B ends with four consecutive zeros (B5=B6=B7=B8=0).

BFF=1, if byte B is composed entirely of ones (B1=B2=...=B8=1).

Figure 5:
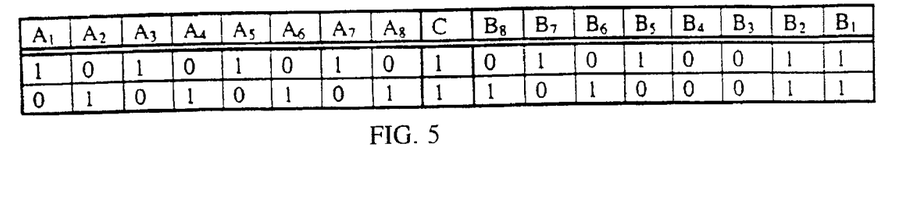
FIG. 5 is a table of rows of bits, wherein the first row includes an example of a major violation of the A byte, and wherein the second row includes a minor violation of the A byte, in accordance with principles of the present invention.

Two classes of code constraint violations are defined for each byte: violations which remain as code violations even after C is set equal to one, which we call "major violations"; and violations that are righted (i.e. violation is removed) by setting C equal to 1, which we call "minor violations". As an example of a major violation, consider the 16 bit word (AA53 Hex), shown as a top row in the FIG. 5 table. In the top row there is a consecutive even bit equals zero (AE=1), and there is no violation in the B byte of this top row. When a center bit equal to one (C=1) is inserted, there is no effect upon the consecutive even bit equals zero (AE=1) violation. As an example of a minor violation, consider the bottom row of the FIG. 5 table. This row includes the data pattern 55A3 Hex. In the A byte a code violation is present in that all four consecutive odd bits are equal to zero. However, when the center bit is made equal to 1, the run of consecutive zeros in odd positions becomes limited to four, which is a minor violation having the form AO=1. It should be noted that inter-major violations are actually a subclass of the minor violations, since setting the center bit to zero never corrects an existing violation.

We define AV and BV to denote major violations, and av and bv to denote minor violations in bytes A and B respectively. Specifically, AV=AE+AS+AFF (major A)
BV=BE+BS+BFF (major B)
av=AE+AS+AO+AN (minor A)
bv=BE+BS+BO+BN (minor B)

where "+" is used to indicate the logical OR function.

Figure 6:
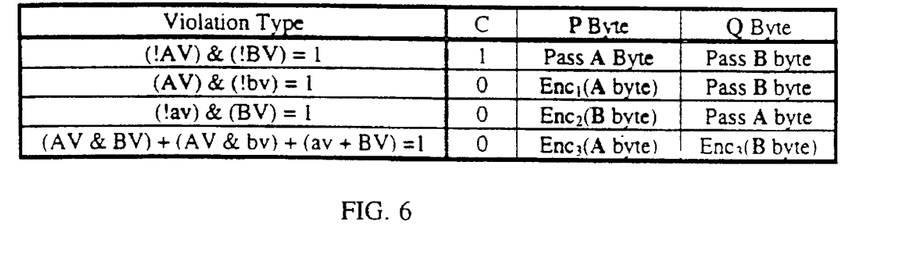
FIG. 6 is a table summarizing encoding rules according to major and minor violations in bytes A and B, in accordance with principles of the present invention.

When an input word has neither a major A nor a major B violation, then the input word is encoded by setting C=1 and passing the A byte to the P byte and the B byte to the Q byte. When there is a major violation in either the A or B byte, then the C bit is set to zero. After setting the C bit to zero, both types of violations cause code constraint violations. Therefore, if one byte has a major violation and the other byte has a major or minor violation, then the second byte must also be mapped to a new byte satisfying the code rules. For instance, consider the word 000f Hex. The A byte (i.e. A=00 Hex) has major violations (AE=AS=1) and the B byte (i.e. B=0f Hex) has only a minor violation (i.e.BN=1). However, since there is a major violation in the A byte, the C bit is set equal to zero, and it is thus possible for a long run of consecutive zeros internal to the codeword. Thus, in this example, it is important that both of the A and B bytes be encoded to avoid the long run of consecutive zeros. The FIG. 6 table summarizes the specific rules under which encoding by the modulation encoder 16 is performed. In FIG. 6 we use the symbol "!" to denote the logical complement of a variable and the symbol "&" to denote the logical AND operation.

Figure 9:
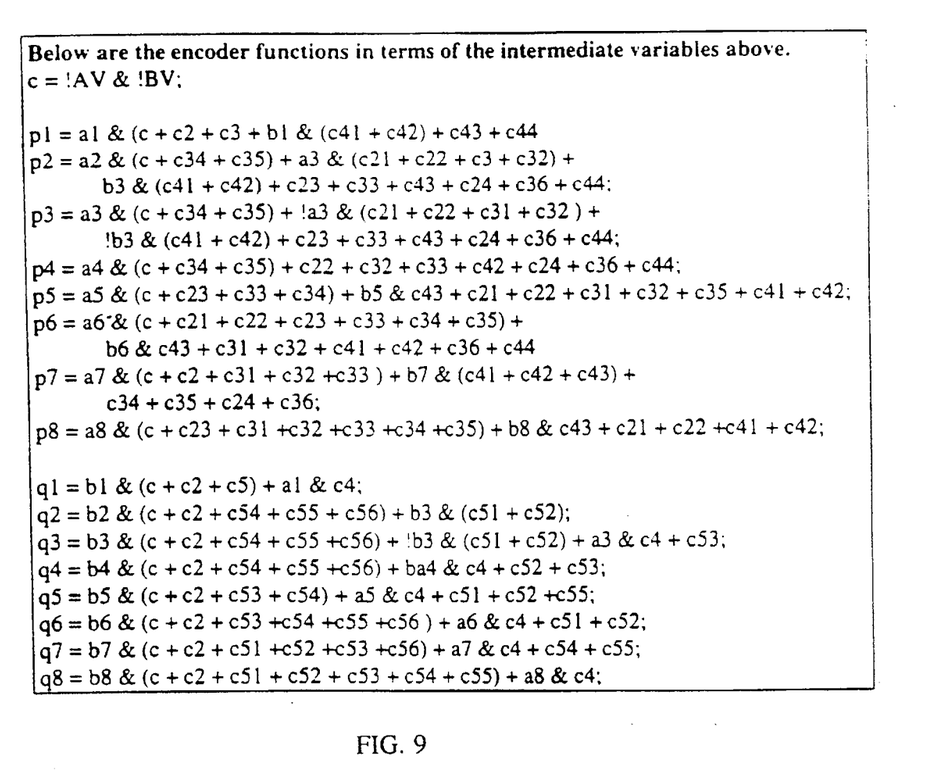
FIG. 9 sets forth a series of encoder function logic equations carried out within the FIG. 7 encoder, based upon the FIG. 8 intermediate values, also in accordance with principles of the present invention.

As explained above FIG. 7 provides a conceptual functional block diagram of the encoder 16 which in practice are implemented within a logic-reduced single combinatorial logic block represented by the logic equations of FIGS. 8 and 9. In FIG. 7, the 16 bit (A and B byte) words of the user data block are received via an input path 15 into the encoder 16. A block 52 causes the bits to be positioned or labelled, for example, in the manner shown in FIG. 2, so that the bit positions of the A byte are symmetrical with the bit positions of the B byte about the center bit C to be inserted in the encoding process. A logic and control block 54 performs a logical test upon the A and B bytes, in accordance with the rules set forth in FIG. 4. If the A and B bytes are within the FIG. 4 coding constraints when the C bit is set to one, the resultant code word is passed without further encoding to a multiplexer 56 and put out via an output path 17. However, if as a result of the logical testing, one of three encode processes is invoked, and the C bit is set to zero. If the A byte violates the coding constraints, an $\text{Enc}_{1(A)}$ encoder 58 encodes the A byte and puts it out as the P byte, while the B byte is put out as the Q byte. If the B byte violates the coding constraints, an $\text{Enc}_{2(B)}$ encoder 60 encodes the B byte and puts it out as the P byte while the A byte is put out as the Q byte. Finally, if the A and B bytes violate the coding constraints, an $\text{Enc}_{3(A,B)}$ encoder 62 encodes the A byte and puts it out as the P byte and encodes the B byte and puts it out as the Q byte.

The encoding functions $\text{Enc}_{1(A)}$, $\text{Enc}_{2(B)}$, and $\text{Enc}_{3(A,B)}$ are determined by mapping minor violation bytes onto bytes with neither major nor minor violations. FIG. 8 sets forth a definition of intermediate variables employed in defining all of the required logic of the modulation encoder 16, while FIG. 9 defines the modulation encoder functions in terms of the intermediate variables defined in FIG. 8. The intermediate variables are defined in FIG. 8 in order to simplify the equations. Accordingly, FIG. 9 defines the encoding functions $\text{Enc}_{1(A)}$, $\text{Enc}_{2(B)}$, and $\text{Enc}_{3(A,B)}$. Specific logical equations for each of the 17 codeword bits may be created from the FIG. 9 encoder function table.

During the decoding process, the modulation decoder 24 first examines the C bit of a codeword. If C equals 1, then decoding is performed by mapping the P byte of the word directly to the A byte and the Q byte of the word directly to the B byte. If, on the other hand, C equals zero, then the value of the P byte determines whether there was a violation in the A byte, the B byte, or in both A and B bytes. If there was a violation in the A byte, then $\text{PeEnc}_{1(P)}$ and B=Q. In this case, the decoding of the P byte to the A byte value is done by inverting the $\text{Enc}_{1(P)}$ function. Similarly, if $\text{PeEnc}_{2(B)}$, then A=Q and the B byte is equal to an inverse mapping of $\text{Enc}_{2(P)}$. Finally, if the original codeword had violations in both the A and B bytes, then $\text{PeEnc}_{3(P)}$ and $Q=\text{Enc}_{3(Q)}$, and the decoder 24 applies the same inverting mapping to both bytes of the codeword.

Figure 10:
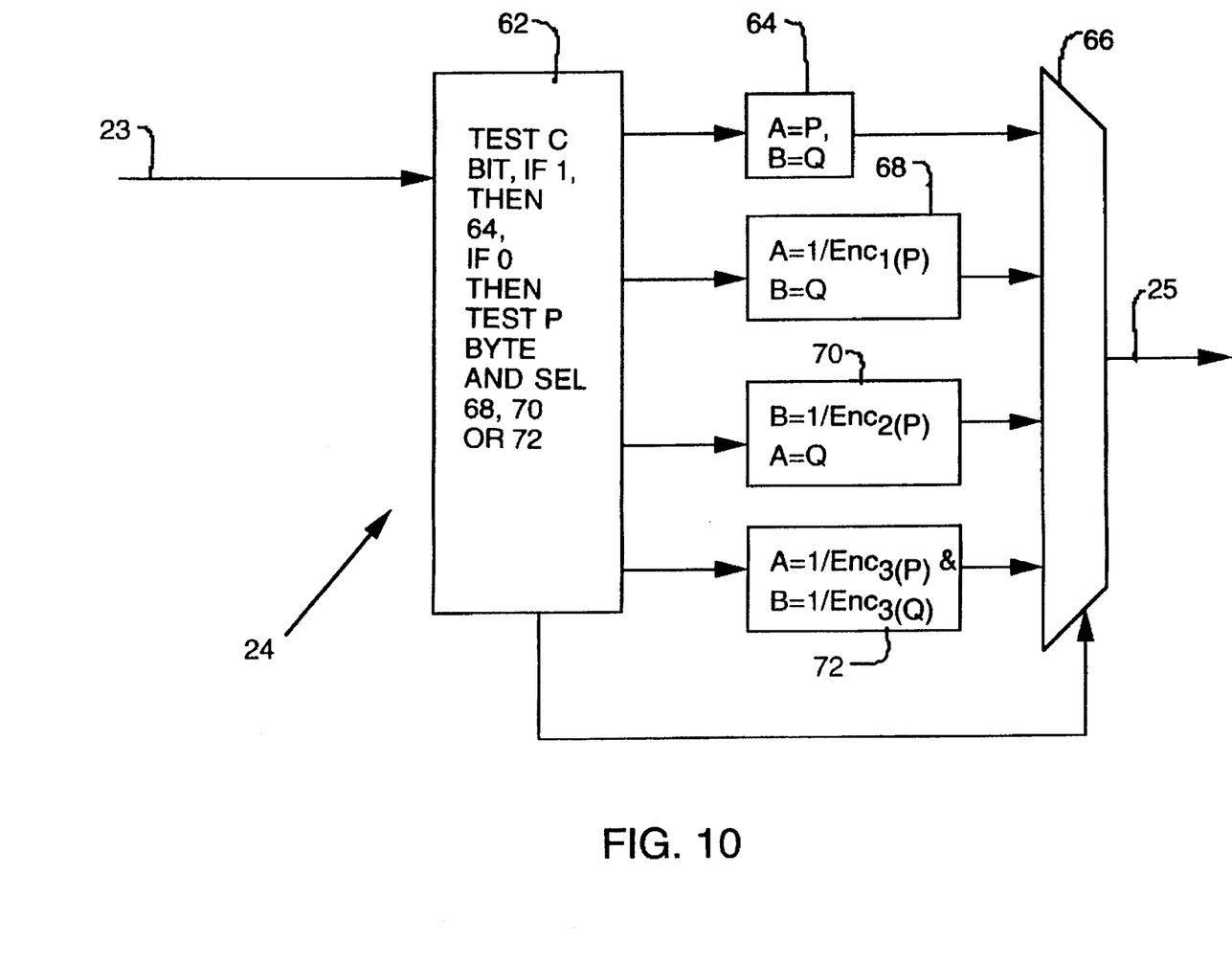
FIG. 10 sets forth a highly diagrammatic conceptual block diagram of a decoder of the FIG. 1 magnetic recording and playback device in accordance with principles of the present invention.

A simplified conceptual block diagram of the modulation decoder 24 is set forth in FIG. 10. In practice, the modulation decoder 24 is preferably implemented as a single logic-reduced combinatorial logic block in accordance with decoder logic equations set forth in FIG. 11. In the simplified functional representation of FIG. 10, codewords are applied via a decoder input path 23 to a logic and control circuit 62 which examines and then removes the C bit of each incoming codeword. If C equals 1, then decoding is by a decoder 64 which maps the A byte directly from the P byte, and which maps the B byte directly from the Q byte and eliminates the C bit. The decoded resultant 16 bit data word is then selected and put out over a decoder output path 25 via a word selector 66 which is controlled by the logic and control circuit 62. If C equals zero, then the value of the P byte determines which encoding function was employed to encode the codeword at the encoder, and one of three inverse functions are invoked, depending upon the value of the P byte: a function 68 which puts out the A byte as an inverse of $Enc_{1(P)}$ and the B byte equal to the Q byte, while removing the C bit; or a function 70 which puts out the B byte as an inverse of $Enc_{2(P)}$ and the A byte equal to the Q byte, while removing the C bit; or a function 72 which puts out the A byte as an inverse of $Enc_{3(P)}$ and the B byte as an inverse of $Enc_{3(Q)}$, while removing the C bit.

Figure 11:
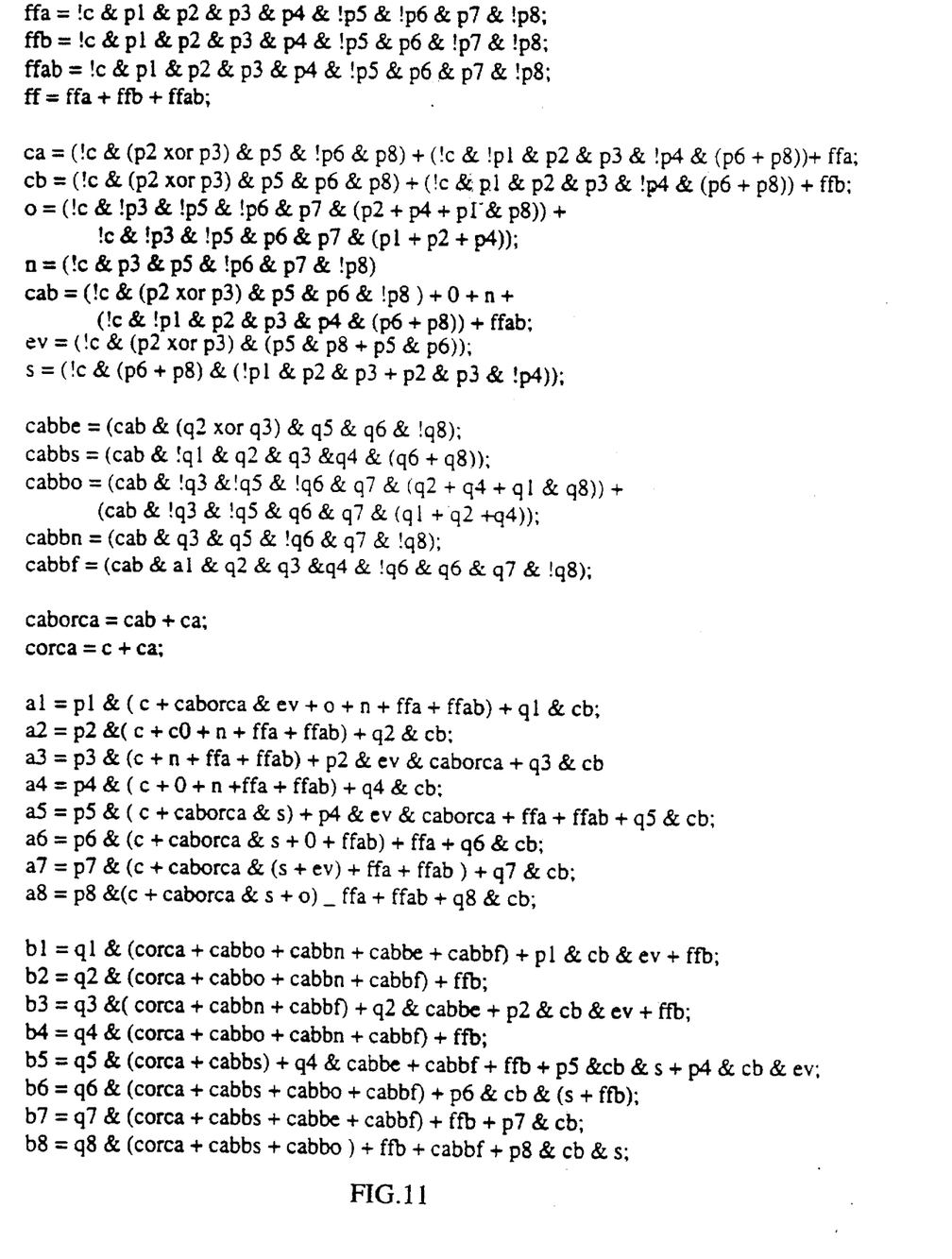
FIG. 11 sets forth a series of logic equations for constructing the FIG. 10 decoder in accordance with principles of the present invention.

Turning now to FIG. 11 and employing the same symbology, the logic for the modulation decoder 24 is created by listing all of the possible code convention violations and the corresponding P byte. Since the P byte is unique for each of the three encodings $Enc_{1(P)}$, $Enc_{2(Q)}$, and $Enc_{3(P,Q)}$, logic equations in FIG. 11 are defined to identify each of the possible groups of encoded bytes.

A primary purpose of the exemplary rate 16/17 (d=0,G= 6/I=7) modulation code described hereinabove is to enable a recording system to achieve higher recording densities than may be achieved with other modulation codes without sacrificing the reliability of the detected data. Secondarily, the new modulation code enables the Viterbi detector 22 to be implemented with a relatively short memory path. The modulation code described herein achieves a higher recording density through a number of features. First, the code rate is 16/17 (0.941) which is approximately 6% higher than a standard rate 8/9 modulation code. This increased rate means that each bit recorded on the disk contains approximately 6% more information than if a rate 8/9 modulation code were employed.

The interleave constraint of the modulation code described herein is limited to seven bits. This constraint means that minimum distance error events are limited in length, and that the corresponding Viterbi detector 22 can be designed with short path memory. This results in a savings of detector size and power, particularly when the detector is formed as, or as part of, a large scale integrated circuit structure. When the modulation code of the present invention is used in conjunction with the $(1/(1+D^2))$ modulo 2 precoder 18 within a partial response recording system 10, ones at the encoder output correspond to nonzero sample values at the input to the Viterbi detector 22. Since the modulation code ensures that ones occur with zero run lengths of no more than six zeros between the ones, nonzero sample values occur frequently, and there is frequent information for the timing and gain loops within the channel 10.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. Within a magnetic recording channel, a method for encoding a sequence of 16 bit digital data words into a sequence of 17 bit codewords in consonance with predetermined minimum zero run length (d), predetermined maximum zero run length (G) and maximum interleave zero run length (I) coding constraints for recording upon a magnetic medium, comprising the steps of:

dividing the 16 bit data word into an 8-bit A byte: a1, a2, a3, a4, a5, a6, a7, a8; and an 8-bit B byte b1, b2, b3, b4, b5, b6, b7, b8, separately testing the A and B bytes for violation of coding constraints, generating P and Q code bytes from the A and B bytes and inserting a center bit C of value one or zero between the P and Q code bytes to form the 17 bit codeword, where C=0 indicates the presence of a coding violation in one or both of the A and B bytes, and where $Enc_{1(A\ byte)}$, $Enc_{2(B\ byte)}$ and $Enc_{3(A,B\ bytes)}$ are distinct functions each of which mapping into a coded byte that can be concatenated with C=0 and another validly coded byte to create the 17 bit codeword in accordance with the predetermined coding constraints.

2. The encoding method set forth in claim 1 wherein C is determined in accordance with the following:

| Violation in A | Violation in B | C | P Byte | Q Byte |
|---|---|---|---|---|
| No | No | 1 | Pass A byte | Pass B byte |
| Yes | No | 0 | $Enc_1$ (A byte) | Pass B byte |
| No | Yes | 0 | $Enc_2$ (B byte) | Pass A byte |
| Yes | Yes | 0 | $Enc_3$ (A byte) | $Enc_3$ (B byte). |

3. The encoding method set forth in claim 1 wherein the predetermined coding constraints comprise (d=0, G=6/I=7) such that each codeword is guaranteed to begin or end with fewer than four consecutive zeros; each codeword is guaranteed to begin or end with fewer than four consecutive zeros in bits with even subscripts (i.e. bits $P_2$, $P_4$, $P_6$, $P_8$ or $Q_2$, $Q_4$, $Q_6$, $Q_8$); each codeword is guaranteed to begin or end with fewer than four consecutive zeros in bits with odd subscripts (i.e. bits $P_1$, $P_3$, $P_5$, $P_7$ or $Q_1$, $Q_3$, $Q_5$, $Q_7$); and, all runs of consecutive zeros within a codeword are shorter than seven bits long.

4. The encoding method set forth in claim 1 wherein the step of dividing the 16 bit data word is carried out by defining bit positions of the A and B bytes symmetrically about the center bit C to have a form of p1, p2, p3, p4, p5, p6, p7, p8, C, q8, q7, q6, q5, q4, q3, q2, q1.

5. The encoding method set forth in claim 1 comprising the further step of precoding the sequence of 17 bit codewords in accordance with a predetermined precoding function for partial response signaling.

6. The encoding method set forth in claim 1 wherein the magnetic recording channel is a partial response class IV, maximum likelihood synchronous sampling data detection channel and wherein the predetermined precoding function is $1/(1+D^2)$.

7. The encoding method set forth in claim 4 wherein the encoding functions $Enc_{1(A\ byte)}$, $Enc_{2(B\ byte)}$ and $Enc_{3(A,B\ bytes)}$ are in accordance with the following logical relationships:

c=!AV & !BV;

p1=a1 & (c+c2+c3)+b1 & (c41+c42)+c43+c44;

p2=a2 & (c+c34+c35)+a3 & (c21+c22+c3+c32)+b3 & (c41+c42)+c23+c33+c43+c24+c36+c44;

p3=a3 & (c+c34+c35)+!a3 & (c21+c22+c31+c32)+!b3 & (c41+c42)+c23+c33+c43+c24+c36+c44;

p4=a4 & (c+c34+c35)+c22+c32+c33+c42+c24+c36+c44;

p5=a5 & (c+c23+c33+c34)+b5 & c43+c21+c22+c31+c32+c35+c41+c42;

p6=a6 & (c+c21+c22+c23+c33+c34+c35)+b6 & c43+c31+c32+c41+c42+c36+c44;

p7=a7 & (c+c2 c31+c32+c33)+b7 & (c42+c42+c43)+c34+c35+c24+c36;

p8=a8 & (c+c23+c31+c32+c33+c34+c35)+b8 & c43+c21+c22+c41+c42;

wherein:

q1=b1 & (c+c2+c5)+a1 & c4;

q2=b2 & (c+c2+c54+c55+c56)+b3 & (c51+c52);

q3=b3 & (c+c2+c54+c55+c56)+!b3 & (c51+c52)+a3 & c4+c53;
q4=b4 & (c+c2+c54+c55+c56)+ba4 & c4+c52+c53;
q5=b5 & (c+c2+c53+c54)+a5 & c4+c51+c52+c55;
q6=b6 & (c+c2+c53+c54+c55+c56)+a6 & c4+c51+c52;
q7=b7 & (c+c2+c51+c52+c53+c56)+a7 & c4+c54+c55;
q8=b8 & (c+c2+c51+c52+c53+c54+c55)+a8 & c4; where,
as=!a1 & !a2 & !a3 & !a4;
ae=!a2 & !a4 & !a6 & !a8;
ao=!a1 & !a3 & !a5 & !a7;
an=!a5 & !a6 & !a7 & !a8;
aft=a1 & a2 & a3 & a4 & a5 & a6 & a7 & a8;
bs=!b1 & !b2 & !b3 & !b4;
be=!b2 & !b4 & !b6 & !b8;
bo=!b1 & !b3 & !b5 & !b7;
bn=!b5 & !b6 & !b7 & !b8;
bff=b1 & b2 & b3 & b4 & b5 & b6 & b7 & b8;
AV=as+ae+aff;
BV=bs+be+bff;
av=as+ae+ao+an+aff;
bv=bs+be+bo+bn+bff;
c21=ae & !a5 & !bv;
c22=a3 & a5 & !bv;
c23=as & !ae & !bv;
c24=aft & !bv;
c2=c21+c22+c23+c24;
c31=ae & !a5 & bv;
c32=ae & a5 & bv;
c33=as & !ae & bv;
c34=ao & !as & !ae & BV;
c35=an & !ao & !as & !ae & BV;
c36=aff & bv;
c3=c31+c32+c33+c34+c35+c36;
c41=be & !bv & !av;
c42=be & b5 & !av
c43=bs & !be & !av;
c44=bff & !av;
c4=c41+c42+c43+c44;
c51=be & !bv & av;
c52=be & b5 & av;
c53=bs & !be & av;
c54=bo & !bs & !be & av;
c55=bn & !bo & !bs & !be & av;
c56=bff & av;
c5=c51+c52+c53+c54+c55+c56.

8. The encoding method set forth in claim 1 comprising the further step of decoding the sequence of 17 bit codewords by the steps of:

testing the C bit to determine if C equals 1, and if so, decoding by mapping the P byte of the codeword directly to the A byte and the Q byte of the codeword directly to the B byte, if the C bit equals zero, testing the P byte of the codeword to determine encoding of the A byte, encoding of the B byte, or encoding of the A and B bytes, and if the P byte results from a set of bytes created from encoding a violation in the A byte, then decoding in accordance with A=InvEnc$_{1(P)}$ and B=Q, where InvEnc$_{1(P)}$ is the inverse of Enc$_{1(P)}$, if there was a violation in the B byte, then decoding in accordance with A=Q and B=InvEnc$_{2(P)}$, where InvEnc$_{2(P)}$ is the inverse of Enc$_{2(P)}$, if there were violations in the A and B bytes, then decoding in accordance with A=InvEnc$_{3(P)}$ and B=InvEnc$_{3(Q)}$, where InvEnc$_{3(P)}$ and InvEnc$_{3(Q)}$ are inverses respectively of Enc$_{3(P)}$ and Enc$_{3(Q)}$, and removing the C bit, in order to put out decoded 16 bit digital data words.

\* \* \* \* \*